US012744253B2

(12) United States Patent
Liu et al.

(10) Patent No.: US 12,744,253 B2
(45) Date of Patent: Sep. 22, 2026

(54) BATTERY WITH BLENDED BATTERY CELLS

(71) Applicant: GM GLOBAL TECHNOLOGY OPERATIONS LLC, Detroit, MI (US)

(72) Inventors: Jingyuan Liu, Shanghai (CN); Haijing Liu, Shanghai (CN); Mark W. Verbrugge, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 678 days.

(21) Appl. No.: 18/127,129

(22) Filed: Mar. 28, 2023

(65) Prior Publication Data

US 2024/0097207 A1 Mar. 21, 2024

(30) Foreign Application Priority Data

Sep. 16, 2022 (CN) ........................ 202211127786.4

(51) Int. Cl.
*H01M 10/42* (2006.01)
*G01R 31/382* (2019.01)
(Continued)

(52) U.S. Cl.
CPC ...... *H01M 10/4207* (2013.01); *G01R 31/382* (2019.01); *G01R 31/392* (2019.01);
(Continued)

(58) Field of Classification Search
CPC .......... H01M 4/05; H01M 4/04; H01M 10/04; H01M 10/05; H01M 50/05
See application file for complete search history.

(56) References Cited

U.S. PATENT DOCUMENTS 9,929,445 B2 3/2018 Yu et al.
9,937,481 B1 4/2018 Liu et al.
(Continued)

FOREIGN PATENT DOCUMENTS

CN 107408724 A 11/2017
CN 208674305 U 3/2019
(Continued)

OTHER PUBLICATIONS

German Office Action from counterpart DE1020231029770, dated Nov. 19, 2024.
(Continued)

*Primary Examiner* — Galen H Hauth
*Assistant Examiner* — Sean R. Brown

(57) ABSTRACT

A battery includes S battery cells of a first type. Each of the S battery cells includes a plurality of first cathode electrodes and a plurality of first anode electrodes. The battery includes T battery cells of a second type, wherein each of the T battery cells includes a plurality of second cathode electrodes and a plurality of second anode electrodes, where S and T are integers greater than one. The T battery cells are arranged between the S battery cells. At least one of the plurality of first cathode electrodes includes a first cathode active material that is different than a second cathode active material of the plurality of second cathode electrodes. The plurality of first anode electrodes includes a first anode active material that is different than a second anode active material of the plurality of second anode electrodes.

20 Claims, 6 Drawing Sheets

(51) Int. Cl.

| | |
|---|---|
| ***G01R 31/392*** | (2019.01) |
| ***H01M 4/505*** | (2010.01) |
| ***H01M 4/525*** | (2010.01) |
| ***H01M 4/58*** | (2010.01) |
| ***H01M 4/583*** | (2010.01) |
| ***H01M 10/48*** | (2006.01) |
| ***H01M 50/509*** | (2021.01) |
| ***H01M 50/51*** | (2021.01) |
| ***H01M 50/512*** | (2021.01) |

(52) U.S. Cl.
CPC ........... *H01M 4/505* (2013.01); *H01M 4/525* (2013.01); *H01M 4/5825* (2013.01); *H01M 4/583* (2013.01); *H01M 10/425* (2013.01); *H01M 10/482* (2013.01); *H01M 50/509* (2021.01); *H01M 50/51* (2021.01); *H01M 50/512* (2021.01)

(56) References Cited

U.S. PATENT DOCUMENTS

| | | | | |
|---|---|---|---|---|
| 10,297,885 | B2 | 5/2019 | Gayden et al. | |
| 10,319,978 | B2 | 6/2019 | Zeng et al. | |
| 10,418,668 | B2 | 9/2019 | Wu et al. | |
| 10,461,318 | B2 | 10/2019 | Zeng et al. | |
| 10,597,783 | B2 | 3/2020 | Liu et al. | |
| 10,601,046 | B2 | 3/2020 | Yu et al. | |
| 10,658,663 | B2 | 5/2020 | Zhang et al. | |
| 10,665,852 | B2 | 5/2020 | Yu et al. | |
| 10,826,139 | B2 | 11/2020 | Rich et al. | |
| 10,944,100 | B2 | 3/2021 | Liu et al. | |
| 11,569,525 | B2 | 1/2023 | Liu et al. | |
| 2016/0105042 | A1 * | 4/2016 | Taylor ................. | H01M 10/446 320/134 |
| 2018/0034094 | A1 * | 2/2018 | Liu ....................... | H01M 4/483 |
| 2019/0013681 | A1 * | 1/2019 | De Breucker .......... | H02J 7/575 |
| 2019/0386259 | A1 * | 12/2019 | Kim .................... | H01M 50/543 |
| 2022/0115686 | A1 | 4/2022 | Liu et al. | |
| 2023/0307720 | A1 * | 9/2023 | Liu ................... | H01M 10/0585 |
| 2025/0183431 | A1 * | 6/2025 | Yoon ................... | H01M 50/533 |

FOREIGN PATENT DOCUMENTS

| | | | |
|---|---|---|---|
| WO | WO-2022021135 | A1 | 2/2022 |
| WO | WO-2022067808 | A1 | 4/2022 |
| WO | WO-2022133960 | A1 | 6/2022 |

OTHER PUBLICATIONS

Office Action received for related CN App. No. 202211127786.4 dated Mar. 18, 2026.

* cited by examiner

BATTERY WITH BLENDED BATTERY CELLS

CROSS-REFERENCE TO RELATED APPLICATIONS

This application claims the benefit of Chinese Patent Application No. 202211127786.4, filed on Sep. 16, 2022. The entire disclosure of the application referenced above is incorporated herein by reference.

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to batteries, and more particularly to batteries including different types of battery cells.

Electric vehicles (EVs) such as battery electric vehicles (BEVs), hybrid vehicles, and/or fuel cell vehicles include one or more electric machines and a battery system including one or more battery cells, modules and/or packs. A power control system is used to control power to/from the battery system during charging, propulsion and/or regeneration. When one of the battery cells of the battery system fails, the battery cells may be damaged and/or thermal runaway may occur. Thermal runaway of one battery cell may cause propagation to other battery cells.

SUMMARY

A battery includes S battery cells of a first type. Each of the S battery cells includes a plurality of first cathode electrodes and a plurality of first anode electrodes. The battery includes T battery cells of a second type, wherein each of the T battery cells includes a plurality of second cathode electrodes and a plurality of second anode electrodes, where S and T are integers greater than one. The T battery cells are arranged between the S battery cells. At least one of the plurality of first cathode electrodes includes a first cathode active material that is different than a second cathode active material of the plurality of second cathode electrodes. The plurality of first anode electrodes includes a first anode active material that is different than a second anode active material of the plurality of second anode electrodes.

In other features, S is greater than T and T is equal to S−1. The S battery cells of the first type and the T battery cells of the second type are arranged in repeating connection segments. For each of the repeating connection segments, corresponding ones of the S battery cells of the first type are connected in series and corresponding ones of the T battery cells of the second type are connected in parallel between the S battery cells.

In other features, the first cathode active material is selected from a group consisting of lithium cobalt oxide (LCO), lithium nickel cobalt manganese (NCM), lithium nickel cobalt aluminum (NCA), nickel cobalt manganese aluminum (NCMA), lithium manganese oxide (LMO), and combinations thereof. The second cathode active material is selected from a group consisting of lithium iron phosphate (LFP), lithium manganese iron phosphate (LMFP), lithium metal polymer (LMP), and combinations thereof.

In other features, the first anode active material is selected from a group consisting of graphite, silicon (Si), and combinations thereof. The second anode active material is selected from a group consisting of lithium titanium oxide (LTO), niobium titanium oxide ($NbTiO_x$), and combinations thereof.

In other features, the first cathode active material has an onset temperature that is less than or equal to 200° C., and the second cathode active material has an onset temperature that is greater than or equal to 250° C.

In other features, the first anode active material has an onset temperature that is less than or equal to 150° C., and the second anode active material has an onset temperature that is greater than or equal to 180° C.

In other features, the S battery cells of the first type are connected in series and the T battery cells of the second type are connected in series.

In other features, a first voltage sensor configured to sense a first voltage of the S battery cells of the first type. A second voltage sensor is configured to sense a second voltage of the T battery cells of the second type. A DC-DC converter is configured to boost the second voltage to the first voltage.

In other features, a controller configured to calculate a first state of charge of the S battery cells of the first type and calculate a second state of charge of the T battery cells of the second type. The controller calculates the first state of charge in a manner that is different than the second state of charge.

In other features, a controller configured to calculate a first state of health of the S battery cells of the first type. The controller calculates a second state of health of the T battery cells of the second type. The controller calculates the first state of health in a manner that is different than the second state of health.

In other features, a polarity of external tabs of at least one of the S battery cells of the first type is inverted relative to others of the S battery cells of the first type. A first thickness of the S battery cells of the first type is different than a second thickness of the T battery cells of the second type.

A battery includes S battery cells of a first type. Each of the S battery cells includes a plurality of first cathode electrodes and a plurality of first anode electrodes. The battery includes T battery cells of a second type. Each of the T battery cells includes a plurality of second cathode electrodes and a plurality of second anode electrodes, where S and T are greater than one. The T battery cells are arranged between the S battery cells. At least one of the plurality of first cathode electrodes includes a first cathode active material that is different than a second cathode active material of the plurality of second cathode electrodes, and the plurality of first anode electrodes includes a first anode active material that is different than a second anode active material of the plurality of second anode electrodes. The first cathode active material has an onset temperature that is less than or equal to 200° C. The second cathode active material has an onset temperature that is greater than or equal to 250° C. The first anode active material has an onset temperature that is less than or equal to 150° C. The second anode active material has an onset temperature that is greater than or equal to 180° C.

In other features, the first cathode active material is selected from a group consisting of lithium cobalt oxide (LCO), lithium nickel cobalt manganese (NCM), lithium nickel cobalt aluminum (NCA), nickel cobalt manganese aluminum (NCMA), lithium manganese oxide (LMO), and combinations thereof. The second cathode active material is selected from a group consisting of lithium iron phosphate (LFP), lithium manganese iron phosphate (LMFP), lithium metal polymer (LMP), and combinations thereof.

In other features, the first anode active material is selected from a group consisting of graphite, silicon (Si), and combinations thereof. The second anode active material is selected from a group consisting of lithium titanium oxide (LTO), niobium titanium oxide ($NbTiO_x$), and combinations thereof. A first thickness of the S battery cells of the first type is different than a second thickness of the T battery cells of the second type. A polarity of external tabs of at least one of the S battery cells of the first type is inverted relative to others of the S battery cells of the first type.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

While the batteries and/or battery cells are described below in the context of vehicles, the batteries and/or battery cells can be used in non-vehicle applications.

A battery according to the present disclosure includes a blend of a first type of battery cells and a second type of battery cells. In some examples, the blend has a 1:1 ratio. In other examples the blend has a S:T ratio (of the first type/second type), where S and T are integers. The first type of battery cells has a higher power density and/or a lower onset temperature for thermal runaway than the second type of battery cells.

The second type of battery cells are arranged between one or more of the first type of battery cells to reduce thermal runaway propagation. In some examples, the second type of battery cells are thinner and have a lower capacity. In some examples, the second type of battery cells are connected in parallel as a group and then serially connected between the first type of battery cells. This type of connection balances volumetric/mass energy density of the battery module/pack.

In other examples, the first type of battery cells is connected in series, the second type of battery cells are connected in series, and a DC/DC converter is used to equalize voltage outputs of the second type of battery cells relative to the first type of battery cells. In some examples, a controller is configured to calculate state of charge (SOC) and/or state of health (SOH) of the first type of battery cells in a manner that is different than the second type of battery cells.

Figure 1:
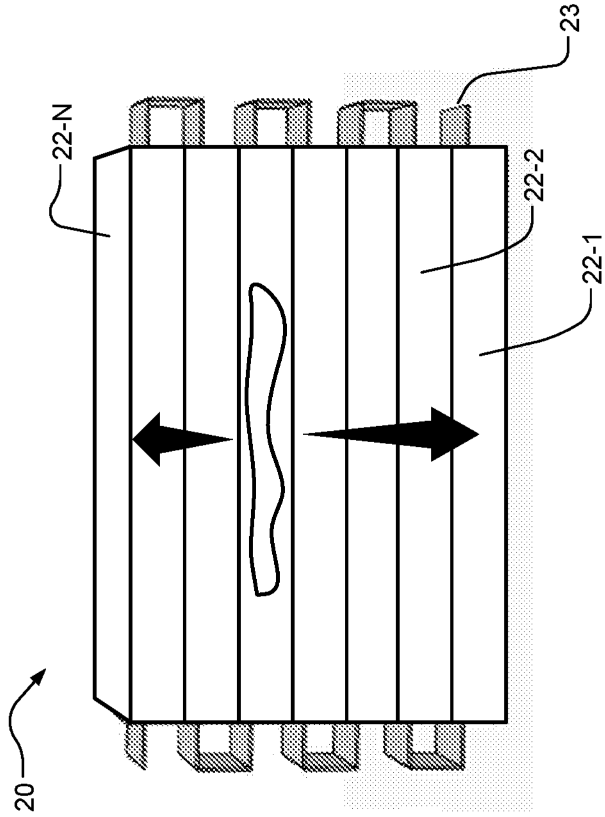
FIG. 1 is a perspective view of an example of a battery including serial connected battery cells.

Referring now to FIG. 1, an example of a battery 20 including serial connected battery cells 22-1, 22-2, . . . , and 22-N (where N is an integer greater than one) is shown. The battery cells 22-1, 22-2, . . . , and 22-N are made using the first type of battery cells. When one of the battery cells fails, the temperature of the battery cell increases, and thermal runaway of the battery cell can occur. Heat from the failed battery cell may propagate to other battery cells and cause thermal runaway propagation.

Figure 2:
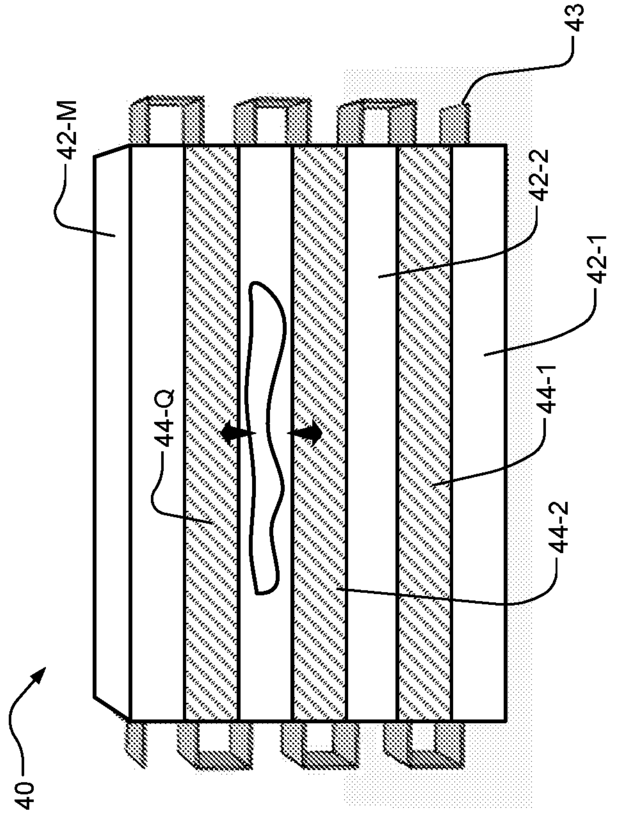
FIG. 2 is a perspective view of an example of a battery including a first type of battery cells and a second type of battery cells that are interleaved and connected together according to the present disclosure.

Referring now to FIG. 2, an example of a battery 40 including the first type of battery cells and a second type of battery cells that are interleaved and connected together is shown. The battery 40 includes battery cells 42-1, 42-2, . . . , and 42-P of a first type (collectively or individually first type of battery cells 42) (where P is an integer greater than one). The battery 40 further includes battery cells 44-1, 44-2, . . . , and 44-Q of a second type (collectively or individually second type of battery cells 44) (where Q is an integer greater than one). The first type of battery cells 42 and the second type of battery cells 44 include external tabs 43.

In some examples, the first type of battery cells 42 have a higher power density and/or a lower onset temperature than the second type of battery cells 42. In other words, the second type of battery cells 42 are less likely to encounter thermal runaway than the first type of battery cells 42.

In some examples, the first type of battery cells 42 are made using different anode and/or cathode active materials than the second type of battery cells 42. In some examples, the first type of battery cell includes cathode active material selected from a group consisting of lithium cobalt oxide (LCO), lithium nickel cobalt manganese (NCM), lithium nickel cobalt aluminum (NCA), nickel cobalt manganese aluminum (NCMA), lithium manganese oxide (LMO), and combinations thereof. In some examples, the first type of battery cells includes cathode active material selected from a group consisting of NCM/NCMA or other high Ni-ternary cathode-based cells. In some examples, the first type of battery cell includes anode active material selected from a group consisting of graphite and silicon (Si).

In some examples, the second type of battery cell include cathode active material selected from a group consisting of lithium iron phosphate (LFP), lithium manganese iron phosphate (LMFP), lithium metal polymer (LMP) (olivine type cathode), and combinations thereof. In some examples, the second type of battery cell include cathode active material selected from a group consisting of LFP/lithium titanium oxide (LTO), and LMFP/LTO. In some examples, the second type of battery cell include anode active material selected from a group consisting of LTO and niobium titanium oxide ($NbTiO_x$).

In some examples, the first type of battery cells includes a cathode active material having an onset temperature less than or equal to 200° C. and the second type of battery cells include a cathode active material having an onset temperature that is greater than or equal to 250° C. In some examples, the first type of battery cells includes an anode active material having an onset temperature less than or equal to 150° C. and the second type of battery cells include an anode active material having an onset temperature that is greater than or equal to 180° C. In some examples, the second type of battery cells include an anode active material having an onset temperature that is greater than or equal to 200° C.

In this example, the first type of battery cells 42 and the second type of battery cells 44 alternate and are connected together. When one of the first type of battery cells 42 fails and encounters thermal runaway conditions, the second type of battery cells 44 provide a thermal block that reduces the likelihood of thermal runaway propagation. One issue with this arrangement is that the thickness of the second type of battery cells 44 would need to be increased if connected in series with the first type of battery cells to handle the current and/or voltage demands of the first type of battery cells 42 during charging and/or discharging. Therefore, some of the examples below include a combination of parallel and series connections.

Figure 3:
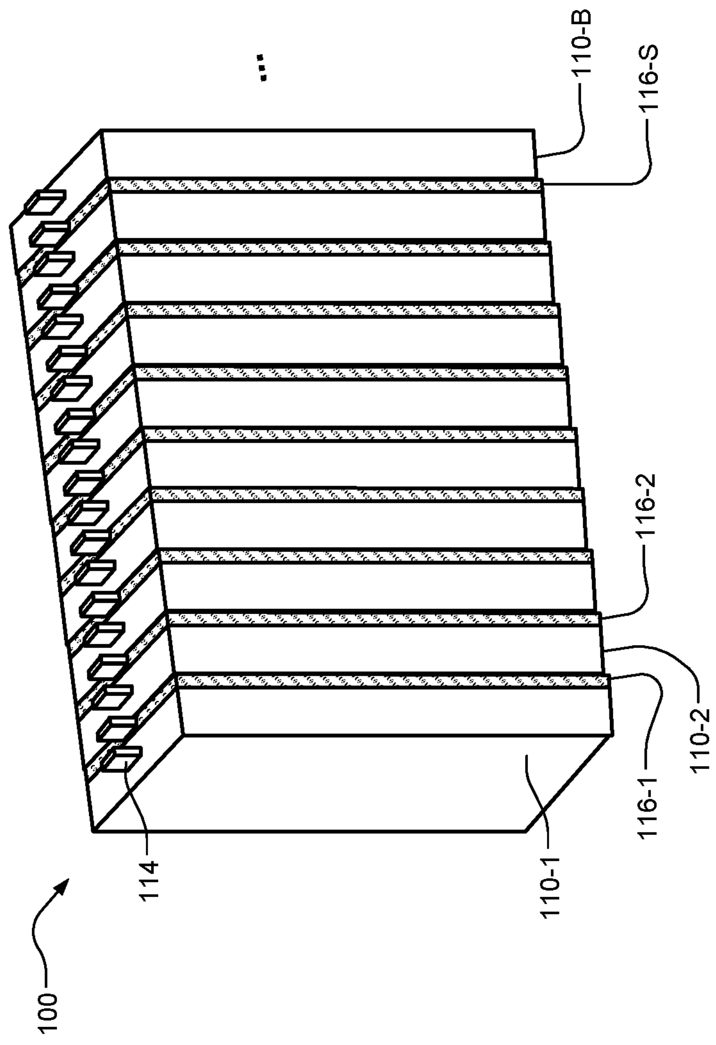
FIG. 3 is a perspective view of an example of a battery including a first type of battery cells and a second type of battery cells that are interleaved and connected together according to the present disclosure.

Referring now to FIG. 3, a battery 100 includes a first type of battery cells and a second type of battery cells that are interleaved and connected together. The battery 100 includes battery cells 110-1, 110-2, . . . , and 110-B of a first type (collectively or individually first type of battery cells 110) (where B is an integer greater than one). The battery 100 further includes battery cells 116-1, 116-2, . . . , and 116-S of a second type (collectively or individually second type of battery cells 116) (where S is an integer greater than one). In this example, S=B−1.

The first type of battery cells 110 and the second type of battery cells 116 include external tabs 114 (corresponding to positive and negative terminals) located on top and bottom sides thereof. As can be appreciated, the positive and negative terminals can be located on adjacent sides, opposite sides, or on the same side. In addition, the location of the positive or negative terminals may be aligned from one battery cell to the next adjacent battery cell or may vary from one battery cell to the next adjacent battery cell.

In some examples, the first type of battery cells 110 have a higher power density and/or a lower onset temperature than the second type of battery cells 116. In other words, the second type of battery cells 116 are less likely to encounter thermal runaway than the first type of battery cells 110. In some examples, the first type of battery cells 110 are made using different anode and/or cathode materials than the second type of battery cells 116. In some examples, the thickness of the first type of battery cells 110 is greater than the thickness of the second type of battery cells 116.

Figure 4:
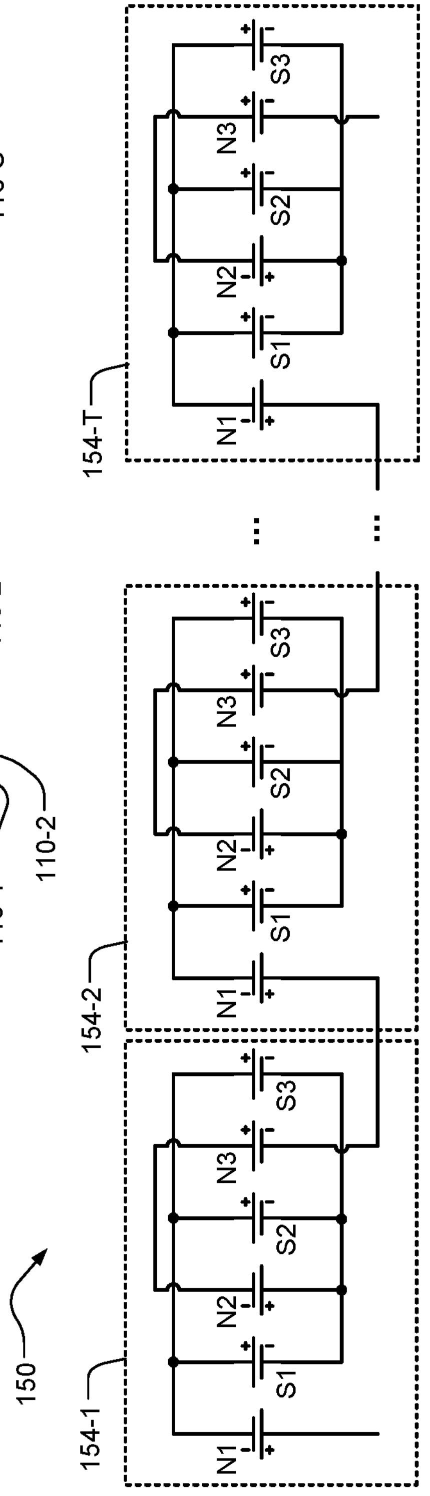
FIG. 4 is an electrical schematic of an example of connections between the first type of battery cells and the second type of battery cells in the battery according to the present disclosure.

Referring now to FIG. 4, an example of a connection arrangement 150 between the first type of battery cells 110 and the second type of battery cells 116 is shown. The connection arrangement 150 includes repeating segments

154-1, 154-2, . . . , and 154-T, (where T is an integer greater than one) having similar connections. In FIG. 4, the first type of battery cells 110 are labelled N1, N2, and N3 for each of the repeating segments and the second type of battery cells 116 are labelled S1, S2 and S3 for each of the repeating segments.

In the repeating segment 154-1, a negative terminal of a battery cell N1 is connected to positive terminals of battery cell S1, S2 and S3. A negative terminal of the battery cell S1 is connected to a positive terminal of the battery cell N2 and negative terminals of the battery cells S2 and S3. A negative terminal of the battery cell N2 is connected to a positive terminal of the battery cell N3. A negative terminal of the battery cell N3 is connected a positive terminal of the battery cell N1 of the repeating segment 154-2 and so on.

A positive terminal of the battery 150 is connected to a positive terminal of the battery cell N1 of the repeating segment 154-1. A negative terminal of the battery is connected to a negative terminal of the battery cell N3 of the repeating segment 154-T.

The battery in FIG. 4 is characterized as follows:

$$Q_{cell\ S1}+Q_{cell\ S2}+Q_{cell\ S3}=Q_{cell\ N1}=Q_{cell\ N2}=Q_{cell\ N3}$$

$$I_{cell\ S1}+I_{cell\ S2}+I_{cell\ S3}=I_{cell\ N1}=I_{cell\ N2}=I_{cell\ N3}=I_{module}$$

$$V_{cell\ S1}=V_{cell\ S2}=V_{cell\ S3}$$

More generally, for an arrangement including n of the first type of battery cells and m of the second type of battery cells and every c ones of the second type of battery cells are connected in parallel: $V_{cell\ N1}*n+V_{cell\ S1}*m/c=V_{module}$.

Figure 5:
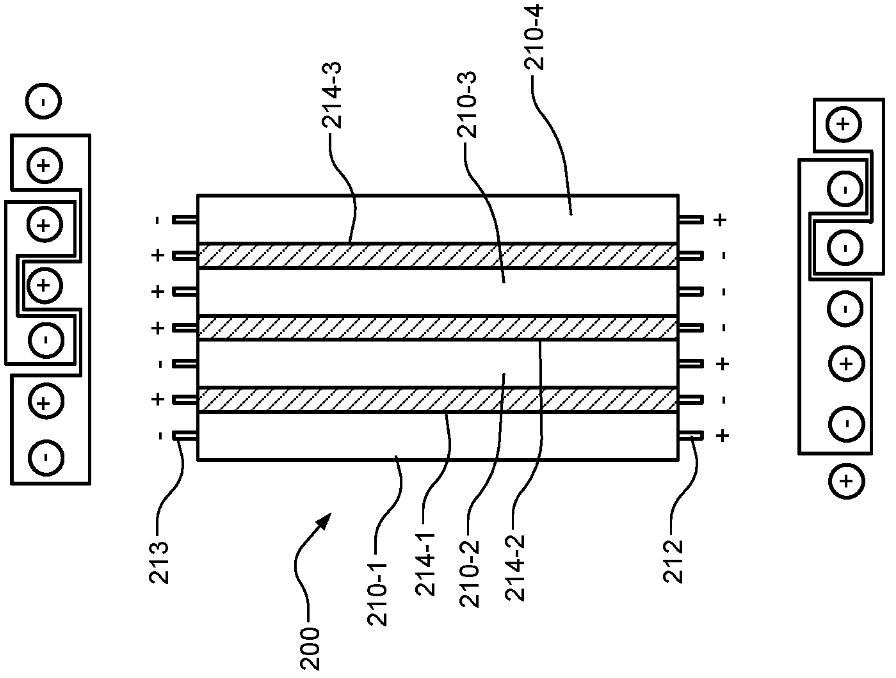
FIG. 5 is an electrical schematic of another example of connections between the first type of battery cells and the second type of battery cells in the battery according to the present disclosure.

Referring now to FIG. 5, another example of connections between the first type of battery cells and the second type of battery cells is shown. A battery 200 includes battery cells 210-1, 210-2, 210-3, and 210-4 of the first type (collectively first type of battery cells 210) and battery cells 214-1, 214-2, and 214-3 of the second type (collectively second type of battery cells 214). The first type of battery cells 210 and the second type of battery cells 214 include a positive terminal 212 and a negative terminal 213.

In this example, the first type of battery cells 210 and the second type of battery cells 214 are arranged as follows: 210-1, 214-1, 210-2, 214-2, 210-3, 214-3, and 210-4. Polarities of the first type of battery cells 210 and the second type of battery cells 214 at one side (e.g., the top side) of the battery 200 are −, +, −, +, +, +, and −. As can be seen, the polarity of at least one of the first type of battery cells (e.g., 210-3) is inverted relative to others of the P battery cells of the first type. Terminals of the battery cells 210-1, 214-1, 214-2, and 214-3 on the one side are shorted. Terminals of the battery cells 210-2 and 210-4 on the one side are shorted.

Polarities of the first type of battery cells 210 and the second type of battery cells 214 at the opposite side (e.g., the bottom side) of the battery 200 are +, −, +, −, −, −, and +. Terminals of the battery cells 214-1, 210-2, 214-2, and 214-3 on the opposite side are shorted. Terminals of the battery cells 210-3 and 210-4 on the opposite side are shorted.

The above description relates to serially connected battery cells 210. In some examples, the battery cells 210 are connected in parallel to some of its neighbors and then serially connected, to form an nSmP connection. In this case, the battery cells 210 connected in parallel have the same tab polarity orientation and have their positive terminal shorted, negative terminal shorted as well. Other connections are the same as those shown in FIG. 5.

Figure 6:
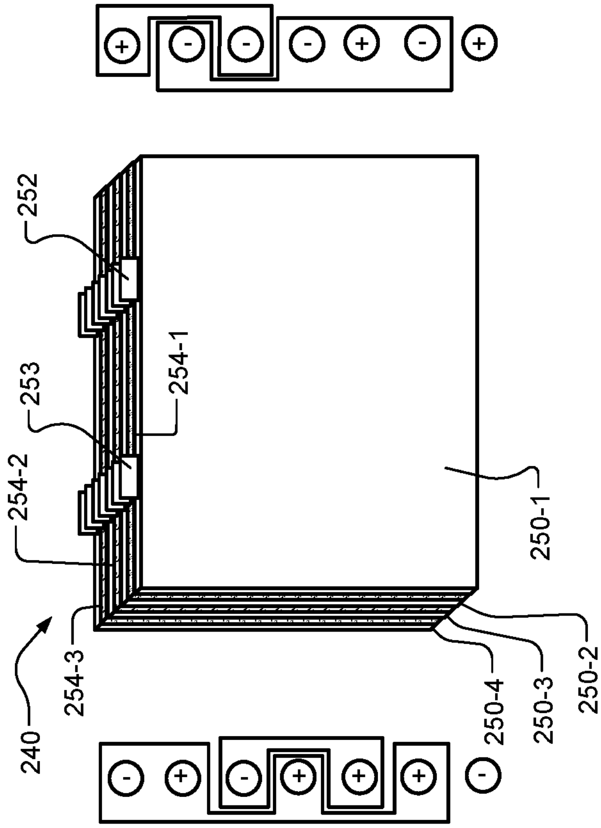
FIG. 6 is an electrical schematic for another example of connections between the first type of battery cells and the second type of battery cells in the battery according to the present disclosure.

Referring now to FIG. 6, another example of connections between the first type of battery cells and the second type of battery cells is shown. A battery 240 includes battery cells 250-1, 250-2, 250-3, and 250-4 (collectively first type of battery cells 250) of the first side and battery cells 254-1, 254-2, and 254-3 of the second type (collectively second type of battery cells 254). The first type of battery cells 250 and the second type of battery cells 254 include first terminals 252 and second terminals 253 located on the same side surface of the battery cells.

In this example, the first type of battery cells 250 and the second type of battery cells 254 are arranged as follows: 250-1, 254-1, 250-2, 254-2, 250-3, 254-3, and 250-4. Polarities of the battery cells at the second terminals 253 of the battery 200 are −, +, +, +, −, +, and −, respectively. The second terminals 253 of the battery cells 254-1, 254-2, 254-3, and 250-4 are shorted. The second terminals 253 of the battery cells 250-2 and 250-3 are shorted.

Polarities of the battery cells at the first terminals 252 of the battery 200 are +, −, +, −, −, −, and +. The first terminals 252 of the battery cells 254-1, 250-2, 254-2, and 254-3 are shorted. The first terminals 252 of the battery cells 250-3 and 250-4 are shorted.

In the above description, the battery cells 250 are connected in series. In some examples, the battery cells 250 are connected in parallel to some of its neighbors and then serially connected, forming an nSmP connection. In this case, the battery cells 250 parallelly connected 250 cells has the same tab polarity orientation and having their positive terminal shorted, negative terminal shorted as well. Other connections are the sane as shown by FIG. 6.

While the preceding example included alternating or interleaved battery cells, other patterns can be used. For example, P battery cells of the first type can be arranged side by side and then R battery cells of the second type can be arranged side by side (where P and R are integers). In some examples, P>1 and R=1, although other values can be used.

Figure 7:
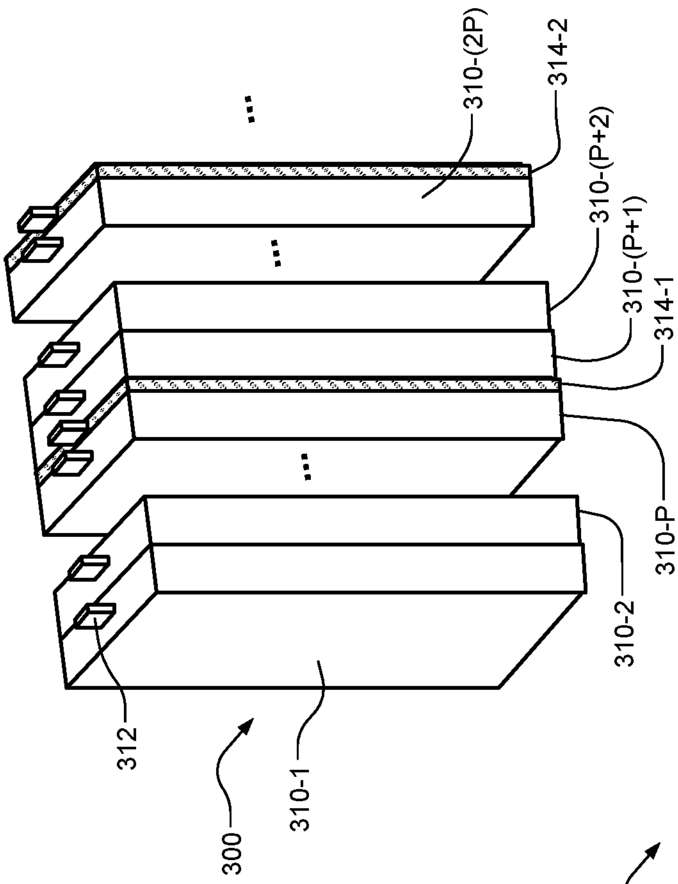
FIG. 7 is a perspective view of another example of a battery including a first type of battery cells and a second type of battery cells that are interleaved and connected together according to the present disclosure.

Referring now to FIG. 7, another example of a battery 300 including a first type of battery cells and a second type of battery cells that are interleaved and connected together is shown. The battery 300 includes battery cells 310-1, 310-2, . . . , 310-P, 310-(P+1), 310-(P+2), 310-(2P) . . . of a first type (collectively or individually first type of battery cells 310) (where P is an integer greater than one). The battery 300 further includes battery cells 314-1, 314-2, . . . of a second type (collectively or individually second type of battery cells 314). The first type of battery cells 310 and the second type of battery cells 314 include external tabs located on top and bottom sides thereof as will be described below.

Figure 8:
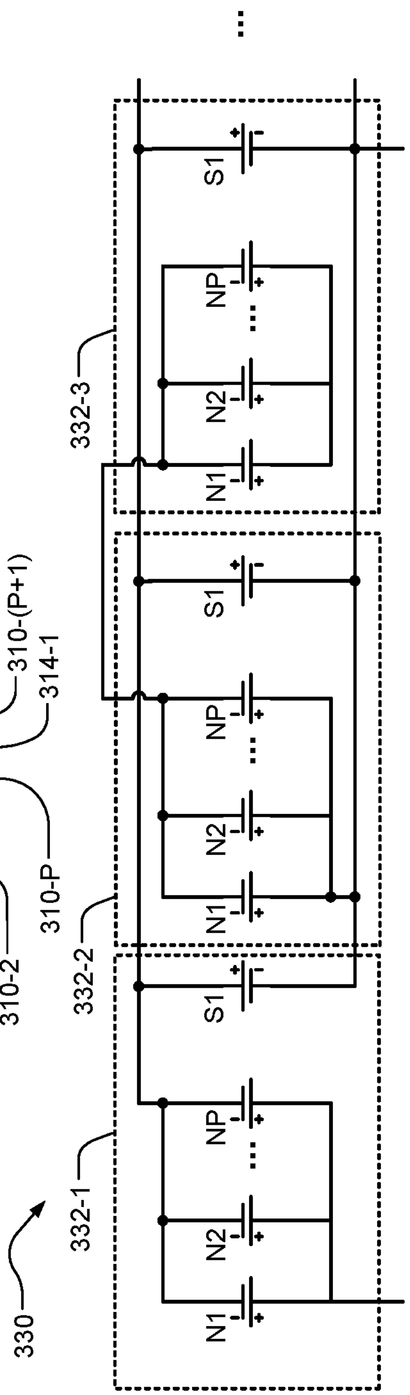
FIG. 8 is an electrical schematic of another example of connections between the first type of battery cells and the second type of battery cells according to the present disclosure.

Referring now to FIG. 8, an example of a connection arrangement 330 between the battery cells 310 and 314 is shown. The connection arrangement 330 includes repeating segments 332-1, 332-2, . . . , and 332-T, (where T is an integer greater than one) having similar connections. In FIG. 8, the battery cells 310 are labelled N1, N2, and NP for each of the repeating segments and the battery cells are labelled S1 for each of the repeating segments.

A negative terminal of a battery cell N1 of the repeating segment 332-1 is connected to negative terminals of the battery cells N2, . . . , and NP of the repeating segment 332-1 and to a positive terminal of a battery cell S1 of the repeating segment 332-1. A positive terminal of the battery cell N1 of the repeating segment 332-1 is connected to positive terminals of the battery cells N2, . . . , and NP of the repeating segment 332-1.

The negative terminal of the battery cell S1 of the repeating segment 332-1 is connected to the positive terminal of the battery cell N1 of the repeating segment 332-2. The positive terminal of the battery cell S1 of the repeating segment 332-1 is connected to the positive terminals of the battery cells S1 of the remaining repeating segments 332-2, 332-3, . . . . The negative terminals of the battery cells N1, N2, . . . , and NP of the repeating segment 332-2 are connected to the negative terminals of the battery cells N1, N2, . . . , and NP of the repeating segment 332-3. Additional repeating segments are connected in a similar way.

The positive terminal of the battery 330 is connected to the positive terminal of the battery cell N1 of the repeating segment 332-1. The negative terminal of the battery 330 is connected to the negative terminal of the battery cell S1 of a last one of the repeating segments (e.g., S1 of the repeating segment 332-3 in this example).

Example 1

In some examples, cathodes of the first type of battery cell have loading of 5 mAh/cm$^2$, active material including NCMA, a specific capacity of 200 mAh/g, and a density of 3.3 g/cc. In some examples, anodes of the first type of battery cell have loading of 5.5 mAh/cm$^2$, active material including graphite/silicon oxide (Gr/$SiO_x$), a specific capacity of 500 mAh/g, and a density of 1.5 g/cc.

In some examples, cathodes of the second type of battery cell have loading of 5 mAh/cm2, active material including LMFP, a specific capacity of 150 mAh/g, and a density of 2.0 g/cc. In some examples, anodes of the second type of battery cell have loading of 5.5 mAh/cm$^2$, active material including LTO, a specific capacity of 160 mAh/g, and a density 2.4 g/cc. In some examples, the separators have a thickness of 10 um. In some examples, the current collectors include aluminum foil having a thickness of 10 um or copper foil having a thickness of 8 um.

In this example, the volumetric energy density ratio of the first type of battery cell divided by the second type of battery cell is approximately 2. Assuming the same cell length/width, a thickness ratio of first type/second type is ~0.5.

In a module with 20 total cells, 4 of the first type of battery cells are replaced by 8 of the second type of battery cells (20% volume). The thickness of second type of battery cells is half of the first type of battery cell. Every 2 of the second type of battery cells are connected in parallel before being serially connected to the first type of battery cells. This arrangement provides a significant reduction in the likelihood of thermal runaway propagation with about 10% volumetric energy density loss.

Example 2

In some examples, cathodes of the first type of battery cell have loading of 5 mAh/cm$^2$, active material including NCMA, a specific capacity of 200 mAh/g, and a density of 3.3 g/cc. In some examples, anodes of the first type of battery cell have loading of 5.5 mAh/cm$^2$, active material including Gr/$SiO_x$, a specific capacity of 500 mAh/g, and a density of 1.5 g/cc.

In some examples, cathodes of the second type of battery cell have loading of 5 mAh/cm$^2$, active material including LMFP, a specific capacity of 150 mAh/g, and a density of 2.0 g/cc. In some examples, anodes of the second type of battery cell have loading of 5.5 mAh/cm$^2$, active material including LTO, a specific capacity of 160 mAh/g, and a density 2.4 g/cc. In some examples, the separators have a thickness of 10 um. In some examples, the current collectors include aluminum foil having a thickness of 10 um or copper foil having a thickness of 8 um. In this example, the volumetric energy density ratio of the first type of battery cell divided by the second type of battery cell is approximately 2. Assuming the same cell length/width, a thickness ratio of first type/second type is ~0.5.

In a module with 20 total cells, 2 of the first type of battery cells are replaced by 8 of the second type of battery cells (10% volume). The thickness of second type of battery cells is one quarter of the first type of battery cell. Every 4 of the second type of battery cells are connected in parallel before being serially connected to the first type of battery cells. This arrangement provides a significant reduction in the likelihood of thermal runaway propagation with about 5% volumetric energy density loss.

Figure 9:
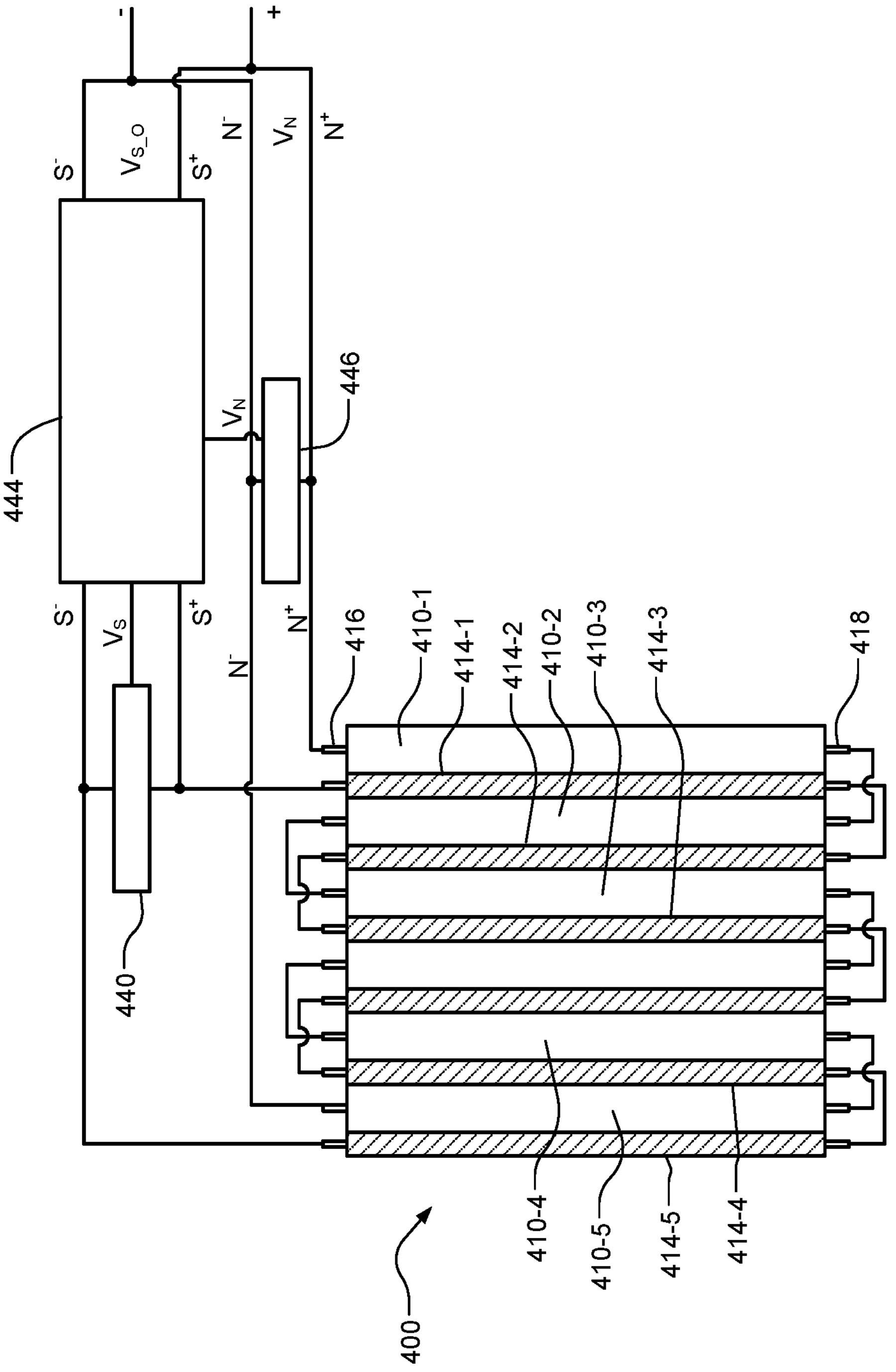
FIG. 9 is an electrical schematic of a battery including the first type of battery cells, the second type of battery cells and a DC/DC converter according to the present disclosure.

Referring now to FIG. 9, a battery 400 including the first type of battery cells and the second type of battery cells and a DC/DC converter is shown. The battery 400 includes battery cells 410-1, 410-2, 410-3, 410-4, and 410-5 of a first type (collectively or individually first type of battery cells 410).

The battery 400 further includes battery cells 414-1, 414-2, 414-3, 414-4, and 414-5 of a second type (collectively or individually second type of battery cells 414). The battery cells 410 and 414 include positive and negative terminals 416 and 418 located on top and bottom sides thereof as will be described below. As can be appreciated, the positive and negative terminals can be located on adjacent sides or the same side.

In this example, the first type of battery cells 410-1, 410-2, 410-3, 410-4, and 410-5 are connected in series and the second type of battery cells 414-1, 414-2, 414-3, 414-4, and 414-5 are connected in series. Positive and negative terminals of the battery cells 414 are connected to an input of the voltage sensor 440 and an input of a DC/DC converter 444. Positive and negative terminals of the battery cells 414 are connected to an input of the voltage sensor 446. The voltage sensors 440 and 446 sense voltage outputs of the second type of battery cells 414 and the first type of battery cells 410, respectively.

In some examples, the DC/DC converter 444 adjusts the voltage output of the second type of battery cells 414 to the output voltage of the first type of battery cells 410. In some examples, the output of the battery cells 414 is boosted. An output of the DC/DC converter 444 is connected to the output of the first type of battery cells 410.

Figure 10:
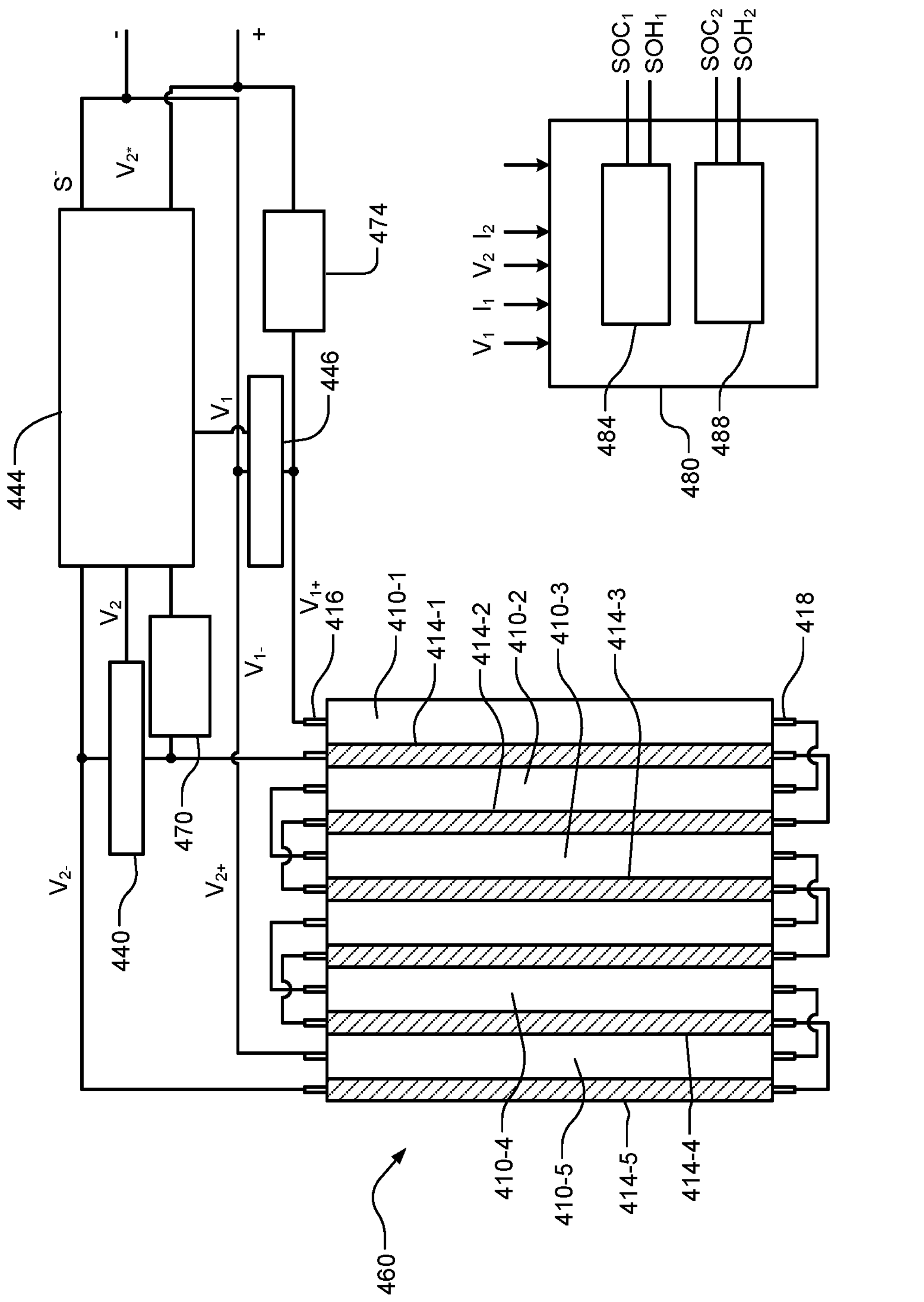
FIG. 10 is an electrical schematic of a battery including the first type of battery cells, the second type of battery cells, a DC/DC converter, and a controller according to the present disclosure.

Referring now to FIG. 10, a battery system 460 further includes a current sensor 470 sensing current from the second type of battery cells and a current sensor 474 sensing current from the first type of battery cells. Outputs of the current sensors 470 and 474, the voltage sensors 440 and 446, and/or other sensed or calculated parameters are input to a controller 480. The controller 480 includes a first module 484 configured to calculate at least one of state of charge ($SOC_1$) or state of health ($SOH_1$) of the first type of battery cells and a second module configured to calculate at least one of state of charge ($SOC_2$) or state of health ($SOH_2$) of the first type of battery cells.

In some examples, the SOC and/or SOH algorithm calculating $SOC_1$ and/or $SOH_1$ for the first type of battery cell is the same as the SOC and/or SOH algorithm calculating $SOC_2$ and/or $SOH_2$ for the second type of battery cells. The first type of battery cells has different chemistry and different response while working as compared to the second type of battery cells. In some examples, the SOC and/or SOH algorithm calculating $SOC_1$ and/or $SOH_1$ for the first type of battery cell is different than the SOC and/or SOH algorithm calculating $SOC_2$ and/or $SOH_2$ for the second type of battery cells.

In some examples, SOC detection parameters (resistance/capacitance (R/C) in RC model, open circuit voltage (OCV), Kalman filter (KF) matrices, etc.) are different and the SOC is calculated independently for the first type of battery cells and the second type of battery cells. In some examples, SOH detection parameters (decaying slope, activation energy/pre-exponential factor ($E_a$/A) in Arrhenius decaying) are different, and the SOC is calculated independently for the first type of battery cells and the second type of battery cells.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A battery system comprising:

a battery including:

S battery cells of a first type, wherein each of the S battery cells includes a plurality of first cathode electrodes and a plurality of first anode electrodes; and T battery cells of a second type, wherein each of the T battery cells includes a plurality of second cathode electrodes and a plurality of second anode electrodes, where S and T are integers greater than one;

a first voltage sensor configured to sense a first output voltage of the S battery cells of the first type connected together;

a second voltage sensor configured to sense a second output voltage of the T battery cells of the second type connected together; and a DC-DC converter including an input and output, the input of the DC-DC converter coupled only to the T battery cells of the second type, the DC-DC converter configured to receive the first output voltage from the first voltage sensor and boost the second output voltage of the T battery cells of the second type to the first output voltage, wherein the output of the DC-DC converter is coupled to an output of the S battery cells of the first type connected together, wherein the T battery cells are arranged between the S battery cells, wherein a volumetric energy density ratio of the S battery cells of the first type to T battery cells of the second type is 2, wherein each S battery cell of the first type is defined by a first thickness, each T battery cell of the second type is defined by a second thickness, the first thickness is greater than the second thickness, and the second thickness of each T battery cell of the second type is one quarter of the first thickness of each S battery cell of the first type, and wherein at least one of:

the plurality of first cathode electrodes includes a first cathode active material that is different than a second cathode active material of the plurality of second cathode electrodes, and the plurality of first anode electrodes includes a first anode active material that is different than a second anode active material of the plurality of second anode electrodes.

2. The battery system of claim 1, wherein S is greater than T.

3. The battery system of claim 1, wherein T is equal to S−1.

4. The battery system of claim 1, wherein the S battery cells of the first type and the T battery cells of the second type are arranged in repeating connection segments.

5. The battery system of claim 4, wherein, for each of the repeating connection segments, corresponding ones of the S battery cells of the first type are connected in series and corresponding ones of the T battery cells of the second type are connected in parallel between the S battery cells.

6. The battery system of claim 1, wherein:
the first cathode active material is selected from a group consisting of lithium cobalt oxide (LCO), lithium nickel cobalt manganese (NCM), lithium nickel cobalt aluminum (NCA), nickel cobalt manganese aluminum (NCMA), lithium manganese oxide (LMO), and combinations thereof, and
the second cathode active material is selected from a group consisting of lithium iron phosphate (LFP), lithium manganese iron phosphate (LMFP), lithium metal polymer (LMP), and combinations thereof.

7. The battery system of claim 1, wherein:
the first anode active material is selected from a group consisting of graphite, silicon (Si), and combinations thereof, and
the second anode active material is selected from a group consisting of lithium titanium oxide (LTO), niobium titanium oxide ($NbTIO_x$), and combinations thereof.

8. The battery system of claim 1, wherein:
the first cathode active material has an onset temperature that is less than or equal to 200° C., and
the second cathode active material has an onset temperature that is greater than or equal to 250° C.

9. The battery system of claim 1, wherein:
the first anode active material has an onset temperature that is less than or equal to 150° C., and
the second anode active material has an onset temperature that is greater than or equal to 180° C.

10. The battery system of claim 1, wherein the S battery cells of the first type are connected in series and the T battery cells of the second type are connected in series.

11. The battery system of claim 1, further comprising a controller configured to:
calculate a first state of charge of the S battery cells of the first type; and
calculate a second state of charge of the T battery cells of the second type,
wherein the controller calculates the first state of charge in a manner that is different than the second state of charge.

12. The battery system of claim 1, further comprising a controller configured to:
calculate a first state of health of the S battery cells of the first type; and
calculate a second state of health of the T battery cells of the second type,
wherein the controller calculates the first state of health in a manner that is different than the second state of health.

13. The battery system of claim 1, wherein a polarity of external tabs of at least one of the S battery cells of the first type is inverted relative to others of the S battery cells of the first type.

14. A battery system comprising:
a battery including:
S battery cells of a first type, wherein each of the S battery cells includes a plurality of first cathode electrodes and a plurality of first anode electrodes; and
T battery cells of a second type, wherein each of the T battery cells includes a plurality of second cathode electrodes and a plurality of second anode electrodes, where S and T are greater than one;
a first voltage sensor configured to sense a first output voltage of the S battery cells of the first type connected together;
a second voltage sensor configured to sense a second output voltage of the T battery cells of the second type connected together; and
a DC-DC converter including an input and output, the input of the DC-DC converter coupled only to the T battery cells of the second type, the DC-DC converter configured to receive the first output voltage from the first voltage sensor and boost the second output voltage of the T battery cells of the second type to the first output voltage, wherein the output of the DC-DC converter is coupled to an output of the S battery cells of the first type connected together,
wherein the T battery cells are arranged between the S battery cells,
wherein a volumetric energy density ratio of the S battery cells of the first type to T battery cells of the second type is 2,
wherein each S battery cell of the first type is defined by a first thickness, each T battery cell of the second type is defined by a second thickness, the first thickness is greater than the second thickness, and the second thickness of each T battery cell of the second is one quarter of the first thickness of each S battery cell of the first type, and
wherein at least one of:
the plurality of first cathode electrodes includes a first cathode active material that is different than a second cathode active material of the plurality of second cathode electrodes, and
the plurality of first anode electrodes includes a first anode active material that is different than a second anode active material of the plurality of second anode electrodes,
wherein the first cathode active material has an onset temperature that is less than or equal to 200° C.,
the second cathode active material has an onset temperature that is greater than or equal to 250° C.,
the first anode active material has an onset temperature that is less than or equal to 150° C., and
the second anode active material has an onset temperature that is greater than or equal to 180° C.

15. The battery system of claim 14, wherein:
the first cathode active material is selected from a group consisting of lithium cobalt oxide (LCO), lithium nickel cobalt manganese (NCM), lithium nickel cobalt aluminum (NCA), nickel cobalt manganese aluminum (NCMA), lithium manganese oxide (LMO), and combinations thereof, and
the second cathode active material is selected from a group consisting of lithium iron phosphate (LFP), lithium manganese iron phosphate (LMFP), lithium metal polymer (LMP), and combinations thereof.

16. The battery system of claim 14, wherein:

the first anode active material is selected from a group consisting of graphite, silicon (Si), and combinations thereof, and the second anode active material is selected from a group consisting of lithium titanium oxide (LTO), niobium titanium oxide ($NbTiO_x$), and combinations thereof.

17. The battery system of claim 14, wherein a polarity of external tabs of at least one of the S battery cells of the first type is inverted relative to others of the S battery cells of the first type.

18. The battery system of claim 1, wherein:

the first cathode electrodes have a loading of 5 mAh/cm$^2$, a specific capacity of 200 mAh/g, and a density of 3.3 g/cc;

the first cathode active material is nickel cobalt manganese aluminum (NCMA), the first anode electrodes have a loading of 5.5 mAh/cm$^2$, a specific capacity of 500 mAh/g, and a density of 1.5 g/cc;

the first anode active material is graphite/silicon oxide ($Gr/SiO_x$);

the second cathode electrodes have a loading of 5 mAh/cm$^2$, a specific capacity of 150 mAh/g, and a density of 2.0 g/cc;

the second cathode active material is lithium manganese iron phosphate (LMFP), the second anode electrodes have a loading of 5.5 mAh/cm$^2$, a specific capacity of 160 mAh/g, and a density 2.4 g/cc;

the second anode active material is lithium titanium oxide (LTO).

19. A battery system comprising:

a battery including:

S battery cells of a first type, wherein each of the S battery cells includes a plurality of first cathode electrodes and a plurality of first anode electrodes, the first cathode electrodes have a loading of 5 mAh/cm$^2$, a specific capacity of 200 mAh/g, and a density of 3.3 g/cc, and the first anode electrodes have a loading of 5.5 mAh/cm$^2$, a specific capacity of 500 mAh/g, and a density of 1.5 g/cc; and T battery cells of a second type, wherein each of the T battery cells includes a plurality of second cathode electrodes and a plurality of second anode electrodes, the second cathode electrodes have a loading of 5 mAh/cm$^2$, a specific capacity of 150 mAh/g, and a density of 2.0 g/cc, and the second anode electrodes have a loading of 5.5 mAh/cm$^2$, a specific capacity of 160 mAh/g, and a density 2.4 g/cc, and where S and T are integers greater than one;

a first voltage sensor configured to sense a first output voltage of the S battery cells of the first type connected together;

a second voltage sensor configured to sense a second output voltage of the T battery cells of the second type connected together; and a DC-DC converter including an input and output, the input of the DC-DC converter coupled only to the T battery cells of the second type, the DC-DC converter configured to receive the first output voltage from the first voltage sensor and boost the second output voltage of the T battery cells of the second type to the first output voltage, wherein the output of the DC-DC converter is coupled to an output of the S battery cells of the first type connected together, wherein the T battery cells are arranged between the S battery cells, wherein each S battery cell of the first type is defined by a first thickness, each T battery cell of the second type is defined by a second thickness, and the first thickness is greater than the second thickness, and wherein at least one of:

the plurality of first cathode electrodes includes a first cathode active material that is nickel cobalt manganese aluminum (NOMA) and the plurality of second cathode electrodes includes a second cathode active material that is lithium manganese iron phosphate (LMFP), and the plurality of first anode electrodes includes a first anode active material that is graphite/silicon oxide ($Gr/SiO_x$) and the plurality of second anode electrodes includes a second anode active material that is lithium titanium oxide (LTO).

20. The battery system of claim 19, wherein:

a volumetric energy density ratio of the S battery cells of the first type to T battery cells of the second type is 2; and the second thickness of each T battery cell of the second type is one quarter of the first thickness of each S battery cell of the first type.

* * * * *